US011057578B2

(12) United States Patent
Juen et al.

(10) Patent No.: US 11,057,578 B2
(45) Date of Patent: Jul. 6, 2021

(54) IMAGE-CAPTURING DEVICE AND IMAGE-CAPTURING SYSTEM

(71) Applicant: NIKON CORPORATION, Tokyo (JP)

(72) Inventors: Masahiro Juen, Yokohama (JP); Toru Takagi, Fujisawa (JP); Osamu Saruwatari, Yokohama (JP); Wataru Funamizu, Yokohama (JP); Sota Nakanishi, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/283,058

(22) Filed: Feb. 22, 2019

(65) Prior Publication Data

US 2019/0191111 A1 Jun. 20, 2019

Related U.S. Application Data

(63) Continuation of application No. PCT/JP2017/028031, filed on Aug. 2, 2017.

(30) Foreign Application Priority Data

Aug. 23, 2016 (JP) .............................. JP2016-162799

(51) Int. Cl.
*H04N 5/351* (2011.01)
*H04N 5/376* (2011.01)
(Continued)

(52) U.S. Cl.
CPC ........... *H04N 5/351* (2013.01); *H01L 27/146* (2013.01); *H04N 5/376* (2013.01); *H04N 5/378* (2013.01)

(58) Field of Classification Search
CPC ........ H04N 5/351; H04N 5/376; H04N 5/378; H01L 27/146
See application file for complete search history.

(56) References Cited

U.S. PATENT DOCUMENTS 7,459,726 B2 12/2008 Kato et al.
9,832,409 B2 11/2017 Kawahito et al.
(Continued)

FOREIGN PATENT DOCUMENTS

JP 4-982 1/1992
JP 2816228 10/1998
(Continued)

OTHER PUBLICATIONS

Extended European Search Report dated May 28, 2019 in corresponding European Patent Application No. 17843348.8 (6 pages).
(Continued)

*Primary Examiner* — Antoinette T Spinks (57) ABSTRACT

An image-capturing device allowing skew reduction, and an image-capturing system allowing skew reduction are provided. An image-capturing device is provided, including a plurality of photoelectric converting units; and a plurality of light-receiving units that are arranged corresponding to a plurality of blocks each constituted by one or more photoelectric converting units, and receive drive light instructing driving of the photoelectric converting units to output a drive signal to a corresponding photoelectric converting unit among the photoelectric converting units. In addition, an image-capturing system is provided, including the image-capturing device; and a light-emitting unit that is spaced apart from the plurality of light-receiving units, and emits the drive light to the plurality of light-receiving units.

15 Claims, 8 Drawing Sheets

(51) Int. Cl.
    *H01L 27/146*    (2006.01)
    *H04N 5/378*    (2011.01)

(56) References Cited

U.S. PATENT DOCUMENTS

| | | |
|---|---|---|
| 2004/0195572 A1 | 10/2004 | Kato et al. |
| 2005/0230629 A1 | 10/2005 | Watanabe et al. |
| 2006/0001918 A1 | 1/2006 | Okano et al. |
| 2007/0210997 A1* | 9/2007 | Kasai .................. B41J 2/45 345/82 |
| 2009/0244048 A1* | 10/2009 | Yamanaka ............ G09G 3/007 345/212 |
| 2013/0068929 A1 | 3/2013 | Solhusvik et al. |
| 2014/0084405 A1 | 3/2014 | Tsuchiya et al. |
| 2016/0353045 A1 | 12/2016 | Kawahito et al. |

FOREIGN PATENT DOCUMENTS

| | | |
|---|---|---|
| JP | 2816228 B2 * | 10/1998 |
| JP | 2004-247405 | 9/2004 |
| JP | 2006-50566 | 2/2006 |
| JP | 2014-67577 | 4/2014 |
| JP | 2014-531820 | 11/2014 |
| WO | WO 2015/119243 A1 | 8/2015 |

OTHER PUBLICATIONS

English translation by WIPO of the Written Opinion of the International Searching Authority dated Feb. 26, 2019 in corresponding International Application No. PCT/JP2017/028031 (9 pages).
International Search Report dated Oct. 10, 2017 in corresponding International Patent Application No. PCT/JP2017/028031.
Written Opinion of the International Searching Authority dated Oct. 10, 2017 in corresponding International Patent Application No. PCT/JP2017/028031.
Japanese Office Action dated Mar. 9, 2020 in Japanese Patent Application No. 2018-535563.
Taiwanese Office Action dated Nov. 6, 2020, in corresponding Taiwanese Patent Application No. 106126507.
Chinese Office Action dated Jul. 23, 2020, in corresponding Chinese Patent Application No. 201780051764.5.

\* cited by examiner

IMAGE-CAPTURING DEVICE AND IMAGE-CAPTURING SYSTEM

This application is a continuation of international application No. PCT/JP2017/028031 filed on Aug. 2, 2017, which claims the foreign priority benefit to Japanese Patent Application No. 2016-162799 filed on Aug. 23, 2016, the disclosures of which are incorporated herein by reference.

BACKGROUND

1. Technical Field

The present invention relates to an image-capturing device and an image-capturing system.

2. Related Art

Conventional image-capturing devices each having a plurality of pixels generate delays (skew) in timing to read out signals since wiring distances for transmitting drive pulses are different pixel by pixel. When conventional image-capturing devices are used, skew is reduced to ¼ or ¹⁄₁₆ by providing internally dividing points of drive control lines inside the image-capturing devices (see Patent Literature 1, for example).

Patent Literature 1: Japanese Patent Application Publication No. 2006-50566

However, conventional image-capturing devices could not reduce skew sufficiently. In addition, conventional image-capturing devices have complicated wiring of drive control lines.

A first aspect of the present invention provides an image-capturing device including: a plurality of photoelectric converting units; and a plurality of light-receiving units that are arranged corresponding to a plurality of blocks each constituted by one or more photoelectric converting units, and receive drive light instructing driving of the photoelectric converting units to output a drive signal to a corresponding photoelectric converting unit among the photoelectric converting units.

A second aspect of the present invention provides an image-capturing system is provided, including the image-capturing device according to the first aspect; and a light-emitting unit that is spaced apart from the plurality of light-receiving units, and emits the drive light to the plurality of light-receiving units.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
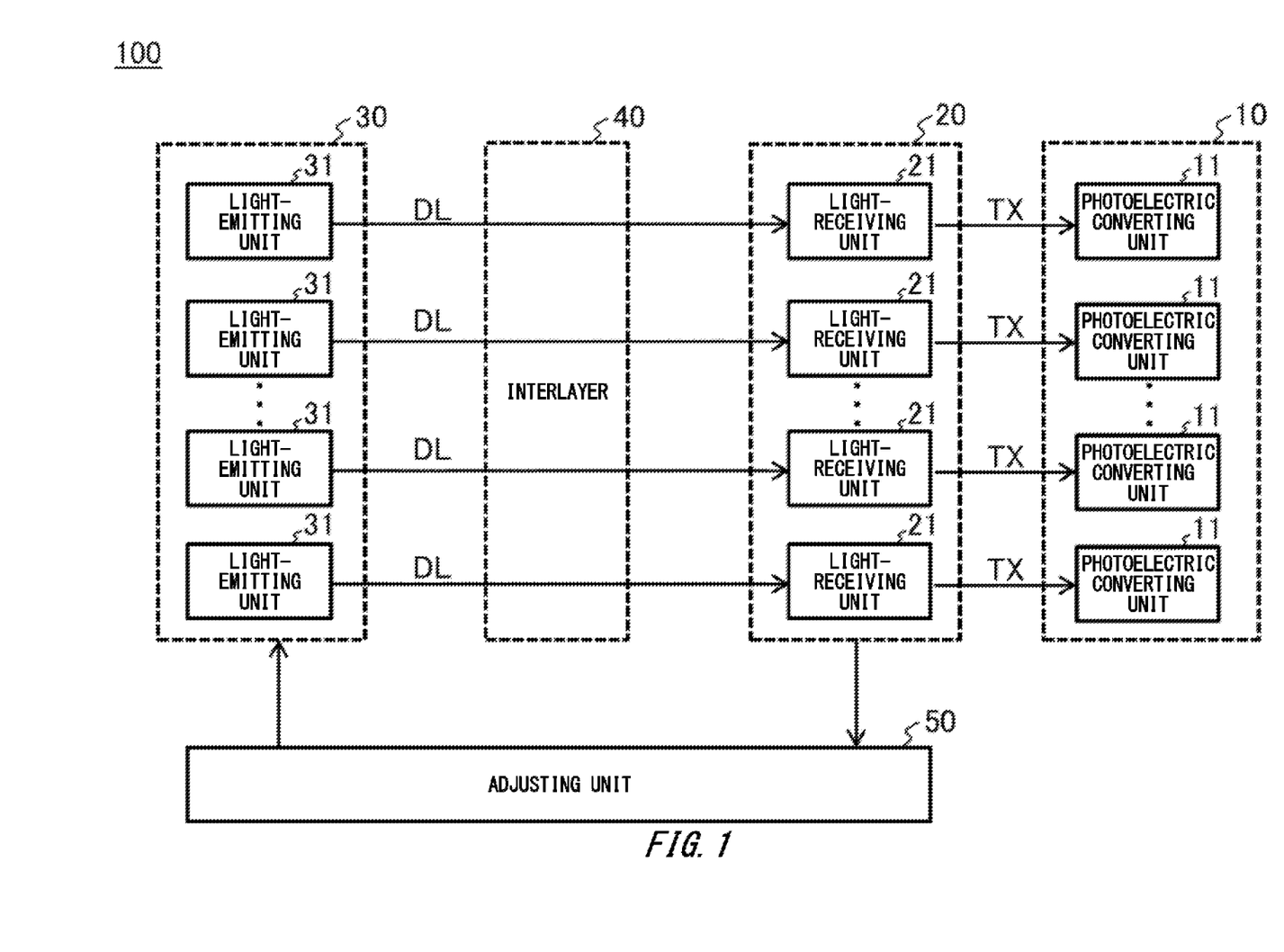
FIG. 1 shows main parts of the configuration of an image-capturing device 100.

FIG. 1 shows main parts of the configuration of an image-capturing device 100. The image-capturing device 100 in the present example includes a photoelectric converting substrate 10, a light-receiving substrate 20, a light-emitting substrate 30, an interlayer 40 and an adjusting unit 50.

The photoelectric converting substrate 10 has a plurality of photoelectric converting units 11. For example, the photoelectric converting substrate 10 has N×M photoelectric converting units 11 arrayed two-dimensionally. The photoelectric converting units 11 in the present example are pixels arrayed in a matrix on a two-dimensional plane. The photoelectric converting units 11 generate electric charges corresponding to the intensity of received light. The photoelectric converting units 11 accumulate the generated electric charges, and output signals corresponding to the amounts of the accumulated electric charges. For example, the photoelectric converting units 11 include circuits such as transistors that perform resetting operation or read-out operation on photoelectric converting elements or accumulated electric charges accumulated by the photoelectric converting elements.

The light-receiving substrate 20 outputs an accumulation signal TX to the photoelectric converting substrate 10 according to received drive light DL. The light-receiving substrate 20 receives drive light DL collectively to be thereby pulse-driven collectively. Thereby, the light-receiving substrate 20 can supply a high-precision (less skewed) accumulation signal TX to the photoelectric converting substrate 10. The accumulation signal TX controls time during which electric charges generated by photoelectric converting elements of the photoelectric converting units 11 are accumulated. The light-receiving substrate 20 may be formed being stacked on the photoelectric converting substrate 10. In addition, the light-receiving substrate 20 may have an analog-digital conversion (ADC) circuit that performs digital conversion on a pixel signal which is an analog signal indicating the amount of light received at the photoelectric converting substrate 10. The light-receiving substrate 20 has a plurality of light-receiving units 21, each of which is arranged corresponding to one or more photoelectric converting units 11.

A light-receiving unit 21 is arranged corresponding to each photoelectric converting unit 11 or each block. In the present specification, a block refers to a collection of any number of photoelectric converting units 11. The light-receiving unit 21 outputs an accumulation signal TX to the corresponding photoelectric converting units 11 according to received drive light DL, and controls accumulation time of the photoelectric converting units 11. For example, if a light-receiving unit 21 is provided to each photoelectric converting unit 11, N×M light-receiving units 21 are arrayed in a matrix, and each light-receiving unit 21 controls accumulation time of a corresponding photoelectric converting unit 11. In addition, if a light-receiving unit 21 provided to each block, light-receiving units 21 are arranged correspondingly to blocks, and a light-receiving unit 21 collectively controls accumulation time of photoelectric converting units 11 included in a corresponding block.

The light-emitting substrate 30 irradiates the light-receiving units 21 with drive light DL to thereby control timing at which the light-receiving units 21 output accumulation signals TX. The light-emitting substrate 30 collectively irradiates the light-receiving units 21 with the drive light DL; as a result, it is possible to suppress skew in the accumulation signals TX more than in the case of collective driving using electrical signals. The light-emitting substrate 30 has a plurality of light-emitting units 31 that irradiate the light-receiving units 21 with drive light DL. The light-emitting substrate 30 in the present example is formed by being stacked on the light-receiving substrate 20. The light-emitting substrate 30 may be provided outside the image-capturing device 100. Note that the light-emitting substrate 30 may have a light drive circuit and a signal processing circuit.

A light-emitting unit 31 is provided corresponding to one or more light-receiving units 21, and emits drive light DL onto the one or more corresponding light-receiving units 21. Although light-emitting units 31 and light-receiving units 21 in the present example are provided in a one-to-one correspondence, the number of light-emitting units 31 may be smaller than the number of light-receiving units 21. For example, if light-emitting units 31 and light-receiving units 21 are provided in a one-to-one correspondence, the light-emitting units 31 are arrayed in a matrix corresponding to the light-receiving units 21. In addition, if a light-emitting unit 31 is provided corresponding to a plurality of light-receiving units 21, the light-emitting unit 31 is arranged corresponding to the plurality of light-receiving units 21, and collectively controls driving of the corresponding plurality of light-receiving units 21. For example, light-emitting units 31 are near infrared laser diode (NIR-LD) arrays or near infrared ray light emitting diode (NIR-LED) arrays.

The interlayer 40 is arranged between light-receiving substrate 20 and light-emitting substrate 30, and propagate drive light DL from the light-emitting units 31 to the light-receiving units 21. For example, the interlayer 40 is constituted by a transparent substrate, an optical fiber or the like that propagate drive light DL. In addition, if the light-receiving substrate 20 and light-emitting substrate 30 are formed being spaced apart from each other, atmospheric air serves as the interlayer 40. The interlayer 40 may diffuse drive light DL and propagate the diffused light to the light-receiving units 21, or may convert drive light DL into collimated light and propagate the collimated light to the light-receiving units 21. For example, the interlayer 40 diffuses drive light DL by means of light diffusing members; as a result, it becomes possible to maintain simultaneity of drive commands even if the number of the light-emitting unit 31 is reduced.

The adjusting unit 50 adjusts timing at which the light-emitting units 31 emit drive light DL. For example, the adjusting unit 50 adjusts the timing such that the light-emitting units 31 emit drive light DL collectively. In addition, the adjusting unit 50 may adjust the timing such that drive light DL is received at the light-receiving substrate 20 collectively. In this case, the adjusting unit 50 inputs, to corresponding light-emitting units 31, feedback signals based on timing at which the light-receiving units 21 received drive light DL. Note that the adjusting unit 50 may be provided corresponding to each photoelectric converting unit 11 or block.

As has been explained, the image-capturing device 100 in the present example uses drive light DL adjusted for each photoelectric converting unit 11 or block to supply an accumulation signal TX. Thereby, the image-capturing device 100 can reduce skew.

Figure 2:
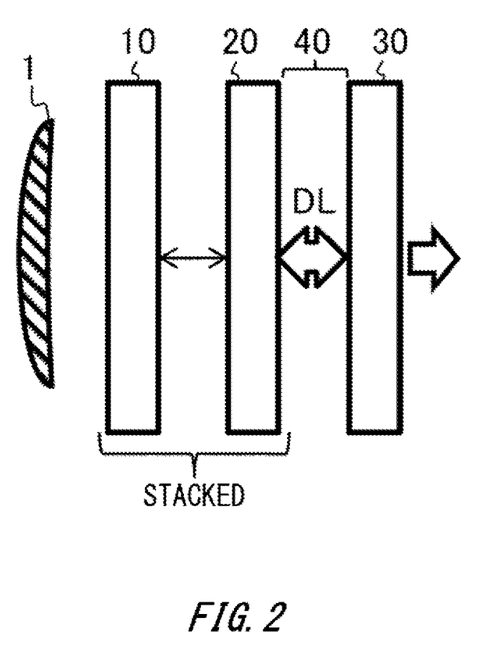
FIG. 2 shows an exemplary configuration of the image-capturing device 100 having a multi-chip structure.

FIG. 2 shows an exemplary configuration of the image-capturing device 100 having a multi-chip structure. The image-capturing device 100 in the present example includes the photoelectric converting substrate 10, the light-receiving substrate 20, and the light-emitting substrate 30. Note that the image-capturing device 100 is provided corresponding to a lens 1.

The photoelectric converting substrate 10 is a pixel chip provided with a plurality of photoelectric converting units 11. The light-receiving substrate 20 is a drive chip that has a drive circuit and an ADC circuit. The chip for the photoelectric converting substrate 10 and the chip for the light-receiving substrate 20 are stacked one on another. For example, the photoelectric converting substrate 10 and the light-receiving substrate 20 are stacked such that a surface of the photoelectric converting substrate 10 on which the photoelectric converting units 11 receive external light and a surface of the light-receiving substrate 20 on which the light-receiving units 21 receive drive light DL face away from each other. External light refers to light that the photoelectric converting units 11 receive. The photoelectric converting units 11 and light-receiving units 21 are electrically connected through wires connecting the chips.

The light-emitting substrate 30 is a chip for driving light and processing signals. The chip for the light-emitting substrate 30 is provided being spaced apart from the stack structure of the photoelectric converting substrate 10 and light-receiving substrate 20. In this case, the interlayer 40 is atmospheric air. The light-emitting substrate 30 irradiates the light-receiving substrate 20 with drive light DL to thereby collectively drive accumulation signals TX. In addition, the chip for the light-emitting substrate 30 may be stacked on the chip for the photoelectric converting substrate 10 and the chip for the light-receiving substrate 20. For example, the light-emitting substrate 30 and the light-receiving substrate 20 are stacked such that a surface of the light-emitting substrate 30 from which the light-emitting units 31 emit drive light DL and a surface of the light-receiving substrate 20 on which the light-receiving units 21 receive drive light DL face each other.

As has been mentioned above, the image-capturing device 100 in the present example is formed by stacking the photoelectric converting substrate 10 and light-receiving substrate 20. Thereby, the image-capturing device 100 can reduce skew without providing complicated drive control lines. Note that the light-emitting substrate 30 is not necessarily stacked on the photoelectric converting substrate 10 and light-receiving substrate 20.

Figure 3:
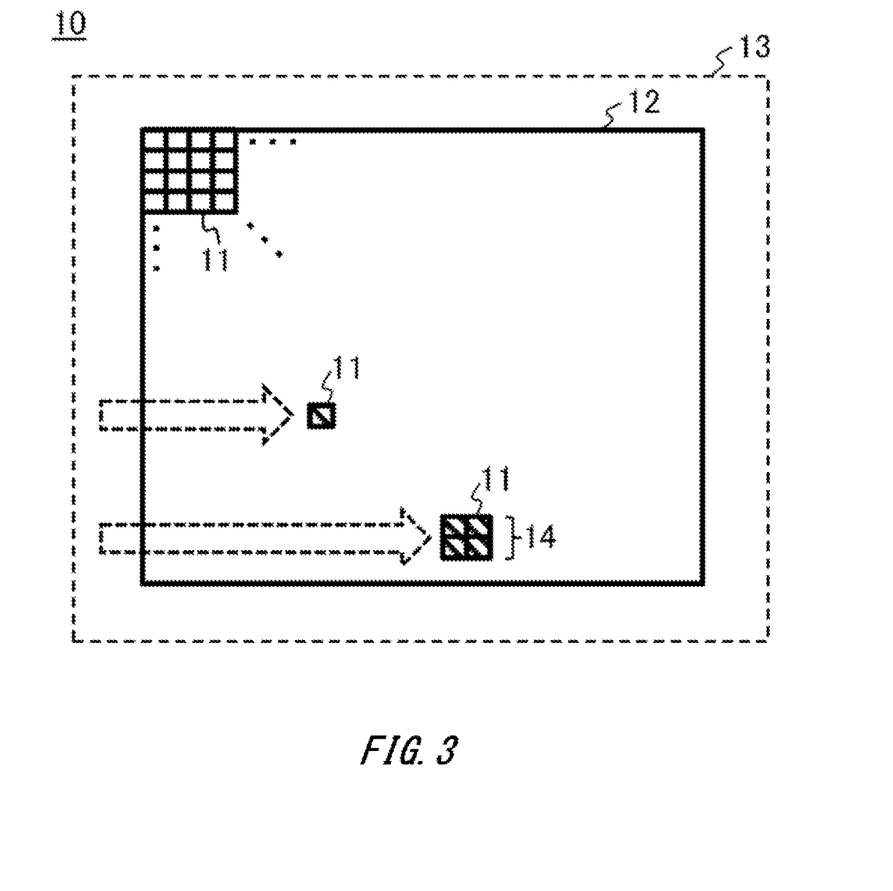
FIG. 3 shows an exemplary cross-sectional view of a photoelectric converting substrate 10 taken in the plane direction thereof.

FIG. 3 shows an exemplary cross-sectional view of the photoelectric converting substrate 10 taken in the plane direction thereof. The photoelectric converting substrate 10 in the present example includes a pixel region 12 in which a plurality of photoelectric converting units 11 are arrayed two-dimensionally. Note that the photoelectric converting substrate 10 in the present example does not have a peripheral region 13 (indicated by broken lines) surrounding the periphery of the photoelectric converting units 11.

The pixel region 12 is a region in which N×M photoelectric converting units 11 are arrayed in a matrix. The pixel region 12 is illustrated as including photoelectric converting units 11 and a block 14, for example. The block 14 is constituted by four photoelectric converting units 11 arrayed in a 2×2 matrix. The block 14 may be constituted by an even number of photoelectric converting units 11, or may be constituted by an odd number of photoelectric converting units 11.

The peripheral region 13 is provided with a drive circuit, a processing circuit, an output circuit or the like for scanning driving of the photoelectric converting substrate 10, in some cases. In this case, since drive signals are supplied from the peripheral region 13 to the photoelectric converting units 11, skew is generated corresponding to the lengths of wires from the peripheral region 13 to corresponding pixels. For example, in the case of a large-sized sensor, skew of about 100 ns is generated unless no measures are taken against skew delays.

The image-capturing device 100 in the present example has a multi-chip structure formed by stacking the respective layers, and control circuits such as the light-receiving units 21 are stacked corresponding to the photoelectric converting units 11 or blocks 14. Thereby, variation in wiring distance between the photoelectric converting units 11 or blocks 14 is reduced. In addition, the image-capturing device 100 uses drive light DL to collectively control the control circuits such as the stacked light-receiving units 21. Thereby, the image-capturing device 100 in the present example can reduce skew to values equal to or shorter than 1 ns. The image-capturing device 100 is particularly effective if high-precision time measurement is required. For example, the image-capturing device 100 is used for TOF for fluorescence observation or precision light measurement.

As has been mentioned, the image-capturing device 100 can supply high-precision (less skewed) accumulation TX pulses without additionally preparing a complicated peripheral circuit. The image-capturing device 100 can perform skew correction in the photoelectric converting substrate 10 for each photoelectric converting unit 11 or block 14. In addition, since the image-capturing device 100 can supply high-precision (less skewed) accumulation TX pulses even if correction is performed after signal acquisition, skew reduction becomes possible to the degree that correction can be performed after signal acquisition even if a ultra high-speed light source is used.

First Embodiment

Figure 4:
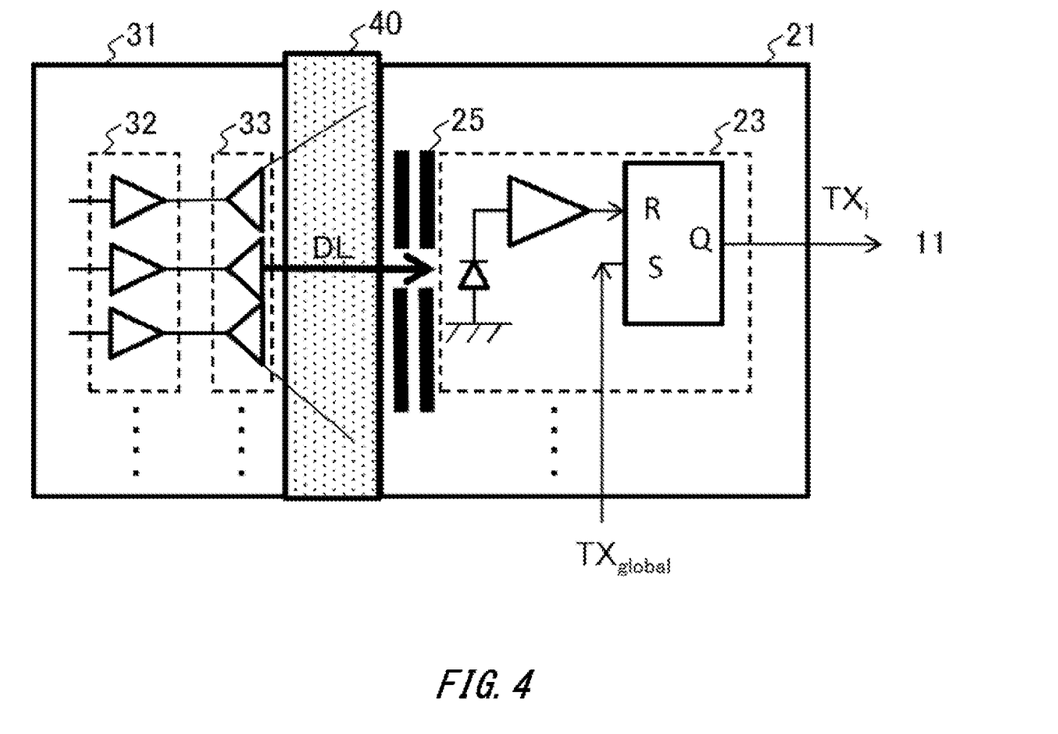
FIG. 4 shows an exemplary configuration of the image-capturing device 100 according to a first embodiment.

FIG. 4 shows an exemplary configuration of the image-capturing device 100 according to a first embodiment. This figure illustrates in particular the case where a light-receiving unit 21 and a light-emitting unit 31 are arranged corresponding to a single photoelectric converting unit 11. The light-receiving unit 21 in the present example includes a synchronous circuit 23 and a light-blocking part 25. In addition, the light-emitting unit 31 includes a correcting unit 32 and a light-emitting array 33.

The synchronous circuit 23 is a synchronous circuit that outputs an accumulation signal TX synchronized with an accumulation reference signal $TX_{global}$, according to drive light DL. For example, the accumulation reference signal $TX_{global}$ is a clock signal shared in the photoelectric converting substrate 10. The synchronous circuit 23 includes a light detecting circuit, a buffer circuit and a latch circuit. The synchronous circuit 23 may be provided for each photoelectric converting unit 11, or may be provided for each block 14. The synchronous circuit 23 receives drive light DL at the light detecting circuit, and inputs a signal to the reset terminal of the latch circuit through the buffer circuit. In addition, the set terminal receives an input of the accumulation reference signal $TX_{global}$. The synchronous circuit 23 outputs an accumulation signal $TX_i$ to a corresponding photoelectric converting unit 11. Note that since the light-receiving substrate 20 is bonded to the photoelectric converting substrate 10, there are no differences, between pixels, in delays in wires from synchronous circuits 23 to photoelectric converting units 11. In addition, the synchronous circuit 23 may not use the accumulation reference signal $TX_{global}$, but may output an accumulation signal $TX_i$ directly upon reception of drive light DL at the light detecting circuit.

The light-blocking part 25 blocks part of drive light DL, and suppresses cross talk between adjacent pixels. The light-blocking part 25 is arranged corresponding to each photoelectric converting unit 11 or block 14. Since the light-blocking part 25 suppresses cross talk between adjacent pixels, it is possible to make timing at which a light-receiving unit 21 outputs an accumulation signal Tx match light-emitting timing of drive light DL from a corresponding light-emitting unit 31. The light-blocking part 25 in the present example may constituted by one stage, or may be constituted by multiple stages. The light-blocking part 25 in the present example is constituted by two light-blocking stages.

A plurality of light-emitting elements are coupled to the light-emitting array 33. The light-emitting array 33 in the present example has an NIR-LD array. The light-emitting array 33 may be provided corresponding to a single light-receiving unit 21, or may be provided corresponding to a plurality of light-receiving units 21.

The correcting unit 32 adjusts the light-emitting timing of drive light DL at the light-emitting array 33 according to a signal input from the adjusting unit 50. For example, the correcting unit 32 corrects the light-emitting timing of drive light DL for each NIR-LD provided to the light-emitting array 33. In addition, the correcting unit 32 may collectively correct the light-emitting timing of drive light DL at a plurality of NIR-LDs provided to the light-emitting array 33. Thereby, drive light DL is collectively input to the synchronous circuit 23 corresponding to each photoelectric converting unit 11.

The interlayer 40 is constituted by a transparent base material that transmits drive light DL. For example, the interlayer 40 is formed of a material with transmittance T of about 0.5. By forming the interlayer 40 with a material that easily causes diffusion, the number of light-emitting arrays 33 may be reduced. For example, the material of the interlayer 40 is decided according to characteristics of drive light DL. The image-capturing device 100 may allow adjustment of the arrangement positions of the light-blocking part 25 and light-emitting array 33 according to the material of the interlayer 40. For example, if a material that easily causes diffusion is used for the interlayer 40, the image-capturing device 100 makes the opening part of the light-blocking part 25 small. In addition, if a material that does not easily cause diffusion is used for the interlayer 40, the image-capturing device 100 may make the opening part of the light-blocking part 25 large.

The image-capturing device 100 can reduce skew of accumulation signals TX by constituting the light-emitting substrate 30 with a relatively small number of LD arrays. For example, the image-capturing device 100 makes possible the precision on the order of ten ps or shorter without calibration, if skew is corrected at layout management and setting at the time of shipment. Note that the image-capturing device 100 has a structure that is similar to back side illumination (BSI: Back Side Illumination) image-capturing devices, and can be manufactured in processes that are similar to those for BSI image-capturing devices.

Second Embodiment

Figure 5:
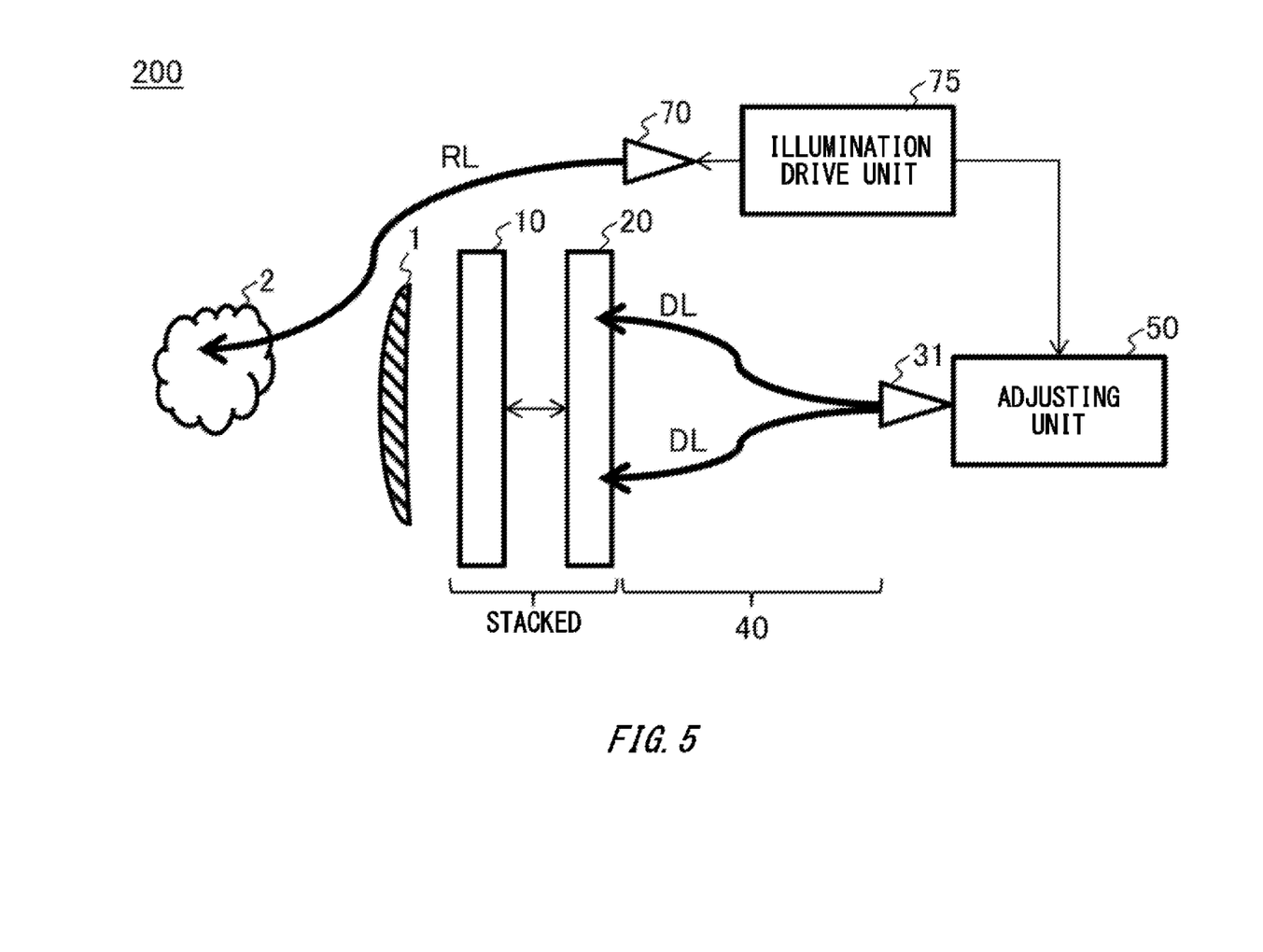
FIG. 5 shows an exemplary configuration of an image-capturing system 200 according to a second embodiment.

FIG. 5 shows an exemplary configuration of an image-capturing system 200 according to a second embodiment. The image-capturing system 200 in the present example further includes an illuminating unit 70 and an illumination drive unit 75, in addition to the image-capturing device 100. The image-capturing system 200 in the present example irradiates a subject 2 with reference light RL, and detects excited light such as fluorescence, or reflected light from the subject 2.

The light-emitting unit 31 uses drive light DL from the rear surface of the light-receiving substrate 20 to collectively pulse-drive a plurality of light-receiving units 21. Light-emitting units 31 in the present example are arranged being spaced apart from the light-receiving units 21, and the number of them is smaller than the number of the light-receiving units 21. Making the number of the light-emitting units 31 smaller than the number of the light-receiving units 21 enhances the skew reduction effect. The light-emitting units 31 are preferably spaced apart from the light-receiving units 21 to the degree that isometry among pixels can be attained. The isometry among pixels refers to that optical path lengths of drive light DL can be regarded as being uniform for all the pixels. The image-capturing device 100 in the present example includes a single light-emitting unit 31 for a plurality of light-receiving units 21 arranged in the light-receiving substrate 20. Note that the image-capturing device 100 may include a plurality of light-emitting units 31.

The interlayer 40 includes atmospheric air or optical fibers as a light transmitting member to transmit drive light DL. The interlayer 40 may propagate drive light DL as collimated light to the light-receiving units 21 by spacing the light-receiving units 21 and light-emitting units 31 apart from each other sufficiently. In addition, the interlayer 40 may include a lens for converting drive light DL into collimated light.

The image-capturing system 200 allows simplification of the configuration of imaging chips by spacing the light-emitting units 31 apart from the light-receiving substrate 20. Here, the imaging chips refer to a pixel chip having the photoelectric converting substrate 10, and an element constituted by a chip stacked on the pixel chip. Simplification of the configurations of the imaging chips is effective for application in endoscopic image-capturing and the like. In addition, the image-capturing system 200 allows suppression of heat-generation from the imaging chips themselves by spacing the light-emitting units 31 apart from the light-receiving substrate 20.

The illuminating unit 70 irradiates the subject 2 with reference light RL to illuminate the subject 2. In addition, the illuminating unit 70 may irradiate the subject 2 with reference light RL to thereby excite the subject 2. The image-capturing system 200 captures an image of the subject 2 by detecting the reference light RL with which the subject 2 is irradiated. The image-capturing system 200 captures images of the subject 2 only during a period in which the subject 2 is irradiated with the reference light RL. The reference light RL may have a different wavelength than that of drive light DL.

The illumination drive unit 75 controls timing at which the illuminating unit 70 emits reference light RL. In synchronization with the adjusting unit 50, the illumination drive unit 75 may adjust timing at which reference light RL is emitted and timing at which drive light DL is emitted. For example, at the same time when the adjusting unit 50 causes the light-emitting units 31 to emit drive light DL, the illumination drive unit 75 causes the illuminating unit 70 to emit reference light RL. In addition, immediately after the illuminating unit 70 is caused to emit reference light RL, the illumination drive unit 75 may output a signal to the adjusting unit 50 to cause emission of drive light DL.

The image-capturing system 200 in the present example can reduce skew to ten ps or shorter by spacing the light-receiving units 21 and light-emitting units 31 sufficiently apart from each other. The image-capturing system 200 in the present example may be applied to endoscopic image-capturing, and acquire only images synchronized with reference light RL.

Third Embodiment

Figure 6:
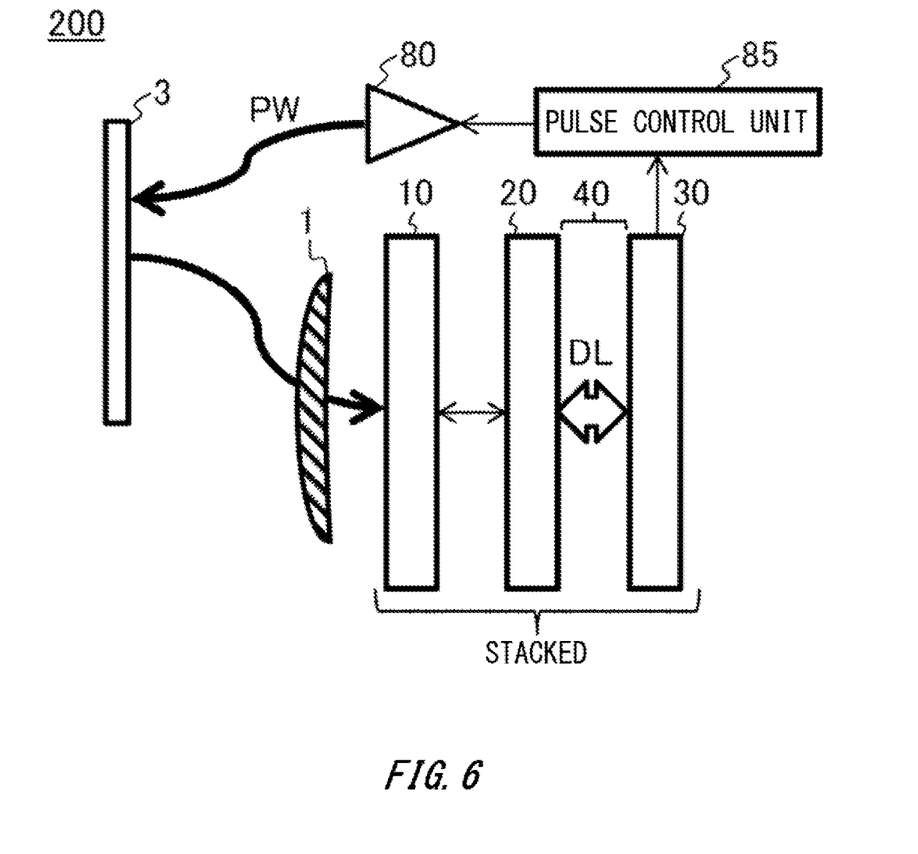
FIG. 6 shows an exemplary configuration of the image-capturing system 200 according to a third embodiment.

FIG. 6 shows an exemplary configuration of the image-capturing system 200 according to a third embodiment. The image-capturing system 200 in the present example corrects skew caused by variation among photoelectric converting units 11 or blocks or the like, by means of calibration. For example, calibration is performed by measuring time for each photoelectric converting unit 11 based on captured images. The image-capturing system 200 in the present example includes a reference plate 3, a reference pulse generating unit 80, and a pulse control unit 85.

The reference pulse generating unit 80 irradiates the reference plate 3 with a pulse wave PW for skew correction. The pulse wave PW has a predetermined pulse length for calibrating skew in accumulation signals TX among pixels. Note that the pulse wave PW has a pulse length which is not particularly limited, but may be set as appropriate according to a method of calibration.

The reference plate 3 reflects or diffuses, toward the lens 1, the pulse wave PW that is incident thereon from the reference pulse generating unit 80. The reference plate 3 may be configured to be automatically inserted according to the timing of calibration. The image-capturing system 200 in the present example adjusts light-emitting timing of drive light DL based on output signals from a plurality of photoelectric converting units 11 at the time when they received the pulse wave PW via the reference plate 3.

The pulse control unit 85 controls timing at which the reference pulse generating unit 80 emits the pulse wave PW. The pulse control unit 85 performs control such that emission of a pulse wave PW and an accumulation signal TX have a predetermined relationship. For example, the pulse control unit 85 emits the pulse wave PW according to the timing of rising or falling of the accumulation signal TX. In addition, the pulse control unit 85 may emit the pulse wave PW according to the timing of rising or falling of trigger pulses PDRST.

Figure 7:
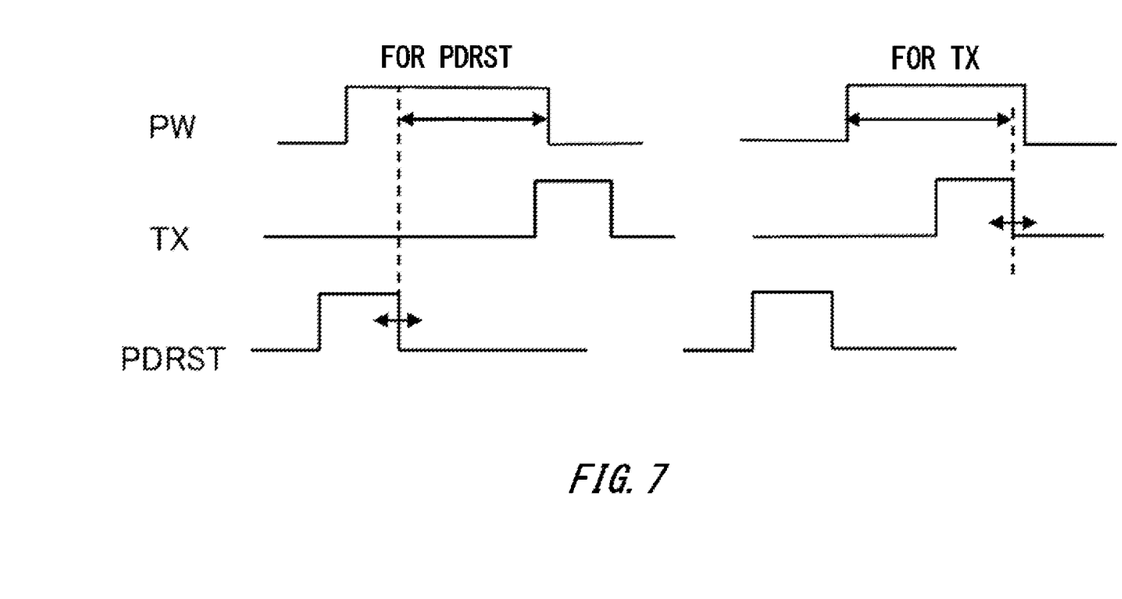
FIG. 7 is a figure for explaining a calibration measurement driving principle according to the third embodiment.

FIG. 7 is a figure for explaining a calibration measurement driving principle according to the third embodiment. The present example shows the case where trigger pulses PDRST are calibrated and the case where accumulation signals TX are calibrated.

When trigger pulses PDRST are calibrated, the trigger pulses PDRST are output during emission of the pulse wave PW. In the present example, control is performed such that falling of the trigger pulses PDRST are included in the period of emission of the pulse wave PW so as to calibrate the timing of falling of the trigger pulses PDRST. The image-capturing system 200 measures, for each photoelectric converting unit 11 or block 14, a length of time from falling of the trigger pulses PDRST to falling of the pulse wave PW. Note that, in the present specification, the length of time from falling of the trigger pulses PDRST to falling of the pulse wave PW is particularly referred to as trigger pulse PDRST down position information.

When accumulation signals TX are calibrated, the accumulation signals TX are output during the period of emission of the pulse wave PW. In the present example, control is performed such that falling of an accumulation signal TX is included in the period of emission of a pulse wave PW so as to calibrate the timing of falling of the accumulation signal TX. The image-capturing system 200 measures, for each photoelectric converting unit 11 or block 14, a length of time from falling of the pulse wave PW to falling of the accumulation signal TX. Note that, in the present specification, the length of time from falling of the pulse wave PW to falling of the accumulation signal TX is particularly referred to as accumulation signal TX down position information.

Figure 8:
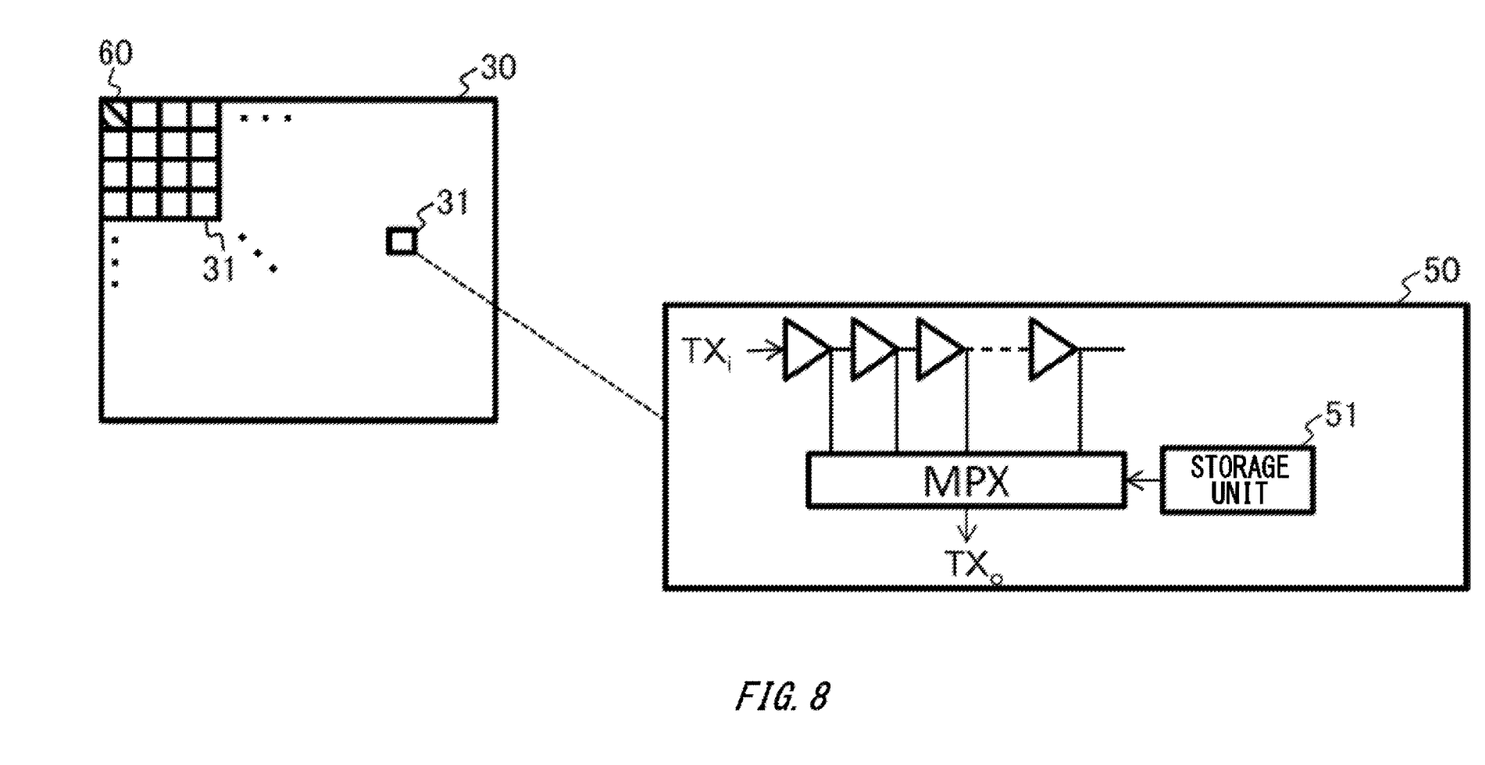
FIG. 8 shows a cross-sectional view of a light-emitting substrate 30 and a more detailed configuration of an adjusting unit 50.

FIG. 8 shows a cross-sectional view of a light-emitting substrate 30 and a more detailed configuration of the adjusting unit 50. In the present example, the image-capturing device 100 includes a temperature detecting unit 60. In addition, the adjusting unit 50 includes a delay circuit, a multiplexer MPX, and a storage unit 51.

The temperature detecting unit 60 detects temperature of the image-capturing device 100. Although the temperature detecting unit 60 in the present example is provided in the light-emitting substrate 30, it may be provided to both the photoelectric converting substrate 10 and the light-receiving substrate 20. In addition, although in the present example one temperature detecting unit 60 is provided at an end portion of the light-emitting substrate 30, a plurality of temperature detecting units 60 may be provided on a surface of the light-emitting substrate 30. In this case, the adjusting unit 50 may use temperature of a temperature detecting unit 60 corresponding to each photoelectric converting unit 11 to adjust, for each photoelectric converting unit 11, timing at which drive light DL is emitted.

The adjusting unit 50 acquires the trigger pulse PDRST or accumulation signal TX down position information. In addition, the adjusting unit 50 performs averaging of the acquire down position information multiple times for each photoelectric converting unit 11. The adjusting unit 50 calculates correction data for each photoelectric converting unit 11. In addition, the adjusting unit 50 adjusts light-emitting timing of drive light DL based on temperature detected by a temperature detecting unit 60. The adjusting unit 50 may be provided to each photoelectric converting unit 11 or block 14.

The storage unit 51 stores correction data calculated by the adjusting unit 50. For example, the correction data is trigger pulse PDRST or accumulation signal TX down position information. In addition, the correction data is data based on temperature detected by the temperature detecting unit(s) 60. The image-capturing device 100 may store a correction data table for each temperature in advance to thereby adjust light-emitting timing of drive light DL based on correction data corresponding to temperature detected by a temperature detecting unit 60. For example, the storage unit 51 updates data to be stored at the time of start of image-capturing. In addition, the storage unit 51 may periodically update the data in a predetermined cycle.

The adjusting unit 50 has a plurality of delay circuits, and delays accumulation signals $TX_i$ by mutually different lengths of delay time. The delayed accumulation signals $TX_i$ are input to the multiplexer MPX, and accumulation signals $TX_o$ corresponding to correction data stored in the storage unit 51 are output. Thereby, the adjusting unit 50 outputs accumulation signals TX at timing corresponding to the down position information or temperature detected by the temperature detecting unit(s) 60. That is, the adjusting unit 50 adjusts timing at which accumulation signals $TX_i$ are output such that signals are output simultaneously from a plurality of photoelectric converting units 11 or blocks.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An image-capturing device comprising:
   a light-receiving substrate including light-receiving units, and having a surface on which drive lights corresponding to the light-receiving units are received, respectively, wherein the light-receiving units perform active processing to produce drive signals corresponding to the received drive lights, respectively; and
   a photoelectric converting substrate including photoelectric converting units that are driven by the drive signals, and having a surface on which the photoelectric converting units receive external light,
   wherein the light-receiving substrate is stacked on the photoelectric converting substrate so that the surface of the light-receiving substrate on which the drive lights corresponding to the light-receiving units are received, and the surface of the photoelectric converting substrate on which the photoelectric converting units receive the external light, face away from each other.

2. The image-capturing device according to claim 1, comprising:
   a light-emitting substrate having one or more light-emitting units that emit the drive lights from a surface of the light-emitting substrate,
   wherein the light-emitting substrate and the light-receiving substrate are stacked such that the surface of the light-emitting substrate from which the drive lights are emitted, and the surface of the light-receiving substrate on which the drive lights are received, face each other.

3. The image-capturing device according to claim 2, wherein the number of the one or more light-emitting units is smaller than the number of the light-receiving units.

4. The image-capturing device according to claim 2, further comprising:
   an adjusting unit that adjusts timing at which the one or more light-emitting units emits the drive lights.

5. The image-capturing device according to claim 4, further comprising:
a reference pulse generating unit to generate a reference pulse and irradiate a predetermined reference subject with the reference pulse, wherein
the photoelectric converting units receive the reference pulse reflected or diffused from the predetermined reference subject, and
the adjusting unit adjusts timing at which the one or more light-emitting units emit the drive lights based on outputs from the photoelectric converting units in response to receiving the reference pulse.

6. The image-capturing device according to claim 4, further comprising:
a temperature detecting unit that detects temperature of the image-capturing device, wherein
the adjusting unit adjusts timing at which the one or more light-emitting units emit the drive lights based on the temperature detected by the temperature detecting unit.

7. The image-capturing device according to claim 1, wherein the light-receiving substrate further includes light-blocking parts corresponding to the light-receiving units to block parts of the drive lights, respectively.

8. An image-capturing system comprising:
the image-capturing device according to claim 1; and
a light-emitting unit that is spaced apart from the light-receiving units, and emits the drive lights to the light-receiving units.

9. The image-capturing system according to claim 8, further comprising:
a light transmitting member that is arranged between the light-emitting unit and the light-receiving units, and transmits the drive lights therethrough to the light-receiving units.

10. The image-capturing system according to claim 8, wherein one light-emitting unit is provided for the light-receiving units.

11. The image-capturing device according to claim 1, wherein the drive lights are optical signals and the drive signals are electrical signals.

12. The image-capturing device according to claim 1, wherein
the light-receiving units correspond to blocks, respectively,
each block of the blocks is constituted by one or more photoelectric converting units of the photoelectric converting units,
each light-receiving unit of the light-receiving units is configured to receive a drive light of the drive lights, perform active processing to produce a drive signal corresponding to the received drive light and which is output to the corresponding block, to instruct driving of the one or more photoelectric converting units constituting the block.

13. The image-capturing device according to claim 12, wherein each light-receiving unit of the light-receiving units includes a latch and, to perform the active processing, the latch is configured to cause the drive signal produced by the light-receiving unit to be in synchronization with a clock signal.

14. An image-capturing device comprising:
a plurality of photoelectric converting units; and
a plurality of light-receiving units corresponding to a plurality of blocks, respectively, wherein
each block of the plurality of blocks is constituted by one or more photoelectric converting units of the plurality of photoelectric converting units, and
each light-receiving unit of the plurality of light-receiving units is configured to receive a drive light and a clock signal, convert the drive light into an electrical signal, and synchronize the electrical signal with the clock signal to thereby produce an electrical drive signal which is output to the corresponding block to instruct driving of the one or more photoelectric converting units constituting the block.

15. The image-capturing device according to claim 13, wherein each light-receiving unit of the plurality of light-receiving units includes a latch configured to synchronize the electrical signal with the clock signal.

\* \* \* \* \*